(12) United States Patent
Bradshaw

(10) Patent No.: US 10,510,408 B2
(45) Date of Patent: Dec. 17, 2019

(54) PROBABILISTIC EVENT DETECTOR FOR FAST OVERWRITE DISTURB REMEDIATION IN PHASE CHANGE MEDIA

(71) Applicant: Micron Technology, Inc., Boise, ID (US)

(72) Inventor: Samuel E. Bradshaw, Sacramento, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/982,939

(22) Filed: May 17, 2018

(65) Prior Publication Data

US 2019/0355415 A1   Nov. 21, 2019

(51) Int. Cl.
| | |
|---|---|
| *G11C 11/00* | (2006.01) |
| *G11C 13/00* | (2006.01) |
| *G11C 29/44* | (2006.01) |
| *G11C 29/52* | (2006.01) |
| *H01L 45/00* | (2006.01) |
| *H01L 27/24* | (2006.01) |

(52) U.S. Cl.
CPC ...... *G11C 13/0033* (2013.01); *G11C 13/0004* (2013.01); *G11C 13/0069* (2013.01); *G11C 29/44* (2013.01); *G11C 29/52* (2013.01); *G11C 2013/0078* (2013.01); *G11C 2213/31* (2013.01); *G11C 2213/33* (2013.01); *G11C 2213/35* (2013.01); *H01L 27/2463* (2013.01); *H01L 45/06* (2013.01); *H01L 45/1233* (2013.01)

(58) Field of Classification Search
CPC .............. G11C 13/003; G11C 13/0004; G11C 13/0069
USPC ........................................................ 365/163
See application file for complete search history.

(56) References Cited

U.S. PATENT DOCUMENTS

| | | | |
|---|---|---|---|
| 9,257,169 B2 * | 2/2016 | Jung | ................. G11C 11/40622 |
| 2016/0034194 A1* | 2/2016 | Brokhman | .......... G06F 12/0246 |
| | | | 711/103 |

* cited by examiner

*Primary Examiner* — Vu A Le

(74) *Attorney, Agent, or Firm* — Nicholson De Vos Webster & Elliott LLP

(57) ABSTRACT

A computer-implemented method for remediating disruptions to memory cells is described. In response to detecting a write to an aggressor memory cell, a remediation event detector locates an entry in a data structure based on an identifier of the aggressor memory cell. Based on the located entry, the remediation event detector determines an increment value. The determined increment value is used by the remediation event detector to increment a disturb counter associated with a neighbor memory cell of the aggressor memory cell. When the disturb counter of the neighbor memory cell is greater than or equal to a disturb threshold, a remediator performs selective remediation for the neighbor memory cell.

20 Claims, 7 Drawing Sheets

PROBABILISTIC EVENT DETECTOR FOR FAST OVERWRITE DISTURB REMEDIATION IN PHASE CHANGE MEDIA

FIELD OF THE INVENTION

The various embodiments described in this document relate to managing memory devices. In particular, embodiments include systems and methods that use a hash table to determine when phase change memory cells are in need of remediation as a result of writes to neighbor memory cells.

BACKGROUND OF THE INVENTION

Research and development of commercially viable memory devices that are randomly accessed, have relatively low power consumption, and are non-volatile is ongoing. One ongoing area of research is in resistive memory cells where resistance states can be changed. One avenue of research relates to devices that store data in memory cells by structurally or chemically changing a physical property of the memory cells in response to applied write voltages and/or current, which in turn changes cell resistance. For example, a memory controller may place a variable resistance material of a memory cell (sometimes referred to as phase change memory cells) into a crystalline phase by passing a crystallizing current through the variable resistance material, thus warming the variable resistance material of the memory cell to a temperature wherein a crystalline structure may grow. The memory controller may use a stronger melting current to melt the variable resistance material of the memory cell for subsequent cooling to the amorphous phase. The different phases of the variable resistance materials represent different binary values and allow the memory controller to write data to the memory cells.

However, writing to a memory cell may cause a write disturb phenomenon to neighbor memory cells (i.e., memory cells that are directly adjacent to a memory cell that is being written). In particular, writes to a memory cell may dissipate heat/thermal energy to neighbor memory cells. With sufficient accumulation of this heat/thermal energy from repeated writes (particularly over a relatively short period of time (e.g., 0-400 milliseconds)), the states of neighbor memory cells are perturbed to the point that a memory controller may no longer be able to reliably determine the state of the neighbor memory cells (i.e., the memory controller may no longer be able to determine the binary value represented by a memory cell).

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
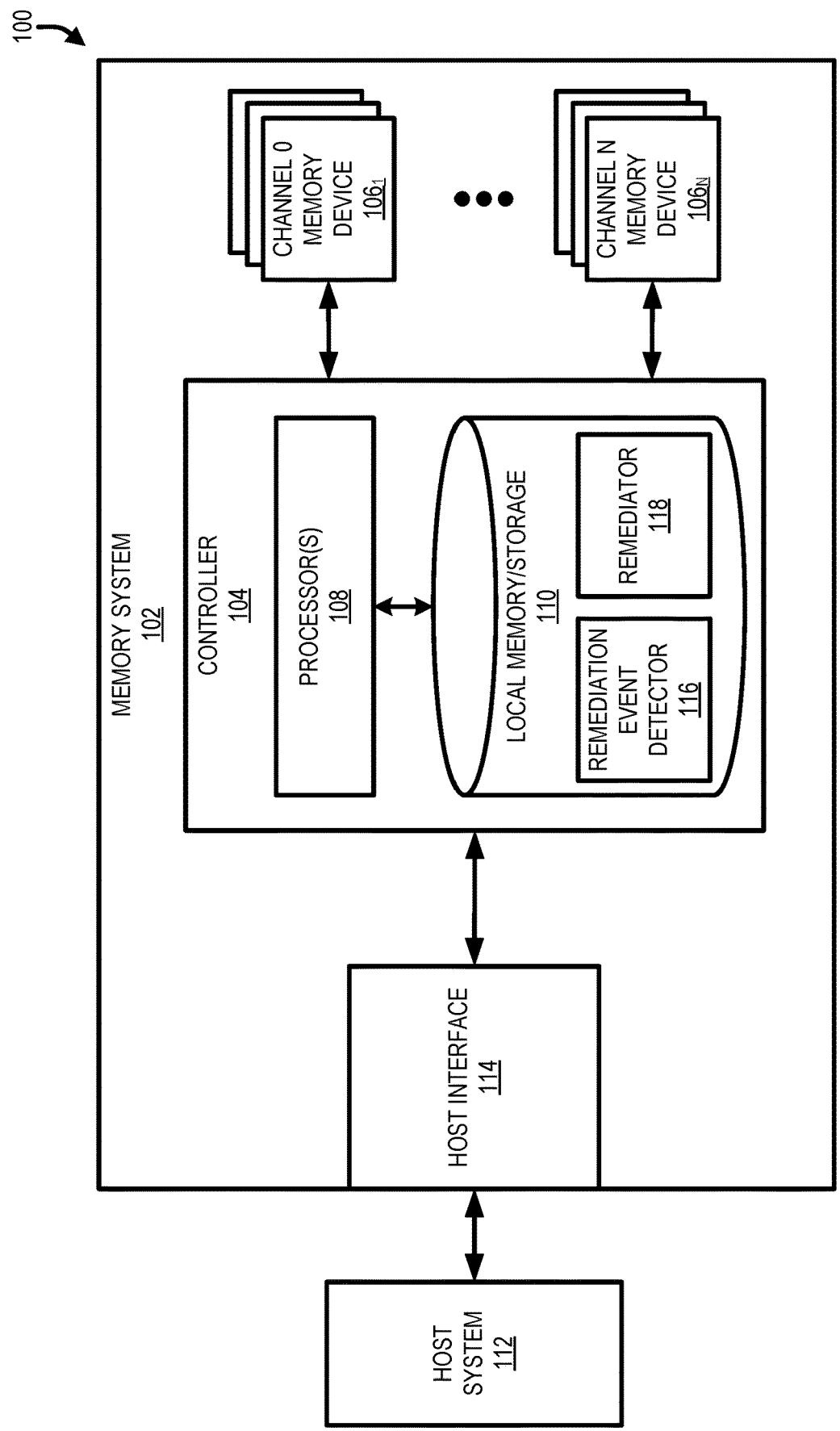
FIG. 1 is a functional block diagram of a computing system, including at least one memory system, in accordance with one or more embodiments.

Systems, methods and devices are described herein for detecting disruptions to a phase change memory cell and determining when these disruptions are cumulatively severe enough to warrant remediation of the phase change memory cell. In particular, a remediation event detector (i.e., a processing device coupled to a memory device) may detect a write to a phase change memory cell (sometimes referred hereinafter as an aggressor phase change memory cell). Based on the remediation event detector detecting the write, the remediation event detector locates an entry in a hash table (i.e., a data structure) based on an address (i.e., an identifier) of the aggressor phase change memory cell. When an address stored in the located entry of the hash table is the same as the address of the aggressor phase change memory cell, the remediation event detector determines that another write to the aggressor phase change memory cell was likely temporally proximate to the presently detected write to the aggressor phase change memory cell. This probable temporal relationship between multiple writes to the same aggressor phase change memory cell may have a large disruptive effect to neighbor phase change memory cells (sometimes referred hereinafter as victim phase change memory cells). Specifically, a write to the aggressor phase change memory cell may dissipate heat/thermal energy to neighbor phase change memory cells. Although a single write to an aggressor phase change memory cell may not dissipate enough heat/thermal energy to disrupt neighbor phase change memory cells (i.e., alter the phase of neighbor phase change memory cells), the cumulative heat/thermal energy from temporally proximate writes may alter the phase of neighbor phase change memory cells before the neighbor phase change memory cells have an opportunity to cool. When temporally proximate writes to the same aggressor phase change memory cell are detected using this hash table approach, an increment value for disturb counters of neighbor phase change memory cells is increased to note this potentially larger disturbance. Thereafter, these disturb counters may be compared against a disturb threshold to determine whether a remediation process should be performed (e.g., a selective remediation process may be employed that examines when actual disturbances to victim phase change memory cells are severe enough to warrant corrective action).

By using a hash table to detect temporally proximate writes to the same phase change memory cells (i.e., the same aggressor phase change memory cells), a probabilistic approach is employed for determining when disturbances to neighbor phase change memory cells may warrant remediation. This probabilistic approach limits overhead costs (e.g., storage costs) while not being overly aggressive when remediating neighbor phase change memory cells (i.e., avoid aggressively rewriting neighbor phase change memory cells). In particular, as will be described in greater detail below, by using a hash table, a lower amount of storage space may be needed for determining potential disturbances to neighbor phase change memory cells in comparison to, for example, storing last write times for each phase change memory cell. Further, since a selective remediation process may be employed that examines when actual disturbances to victim phase change memory cells are severe enough to warrant corrective action, overly aggressive rewrites of phase change memory cells may be avoided.

Although described as phase change memory cells, the techniques, systems, and devices described herein may be similarly applied to any memory cells that potentially experience negative impacts from writes to neighbor memory cells. Accordingly, the use of phase change memory cells herein is for illustrative purposes and is not intended to limit the disclosure.

FIG. 1 is a functional block diagram of a computing system 100, including at least one memory system 102, in accordance with one or more embodiments of the present disclosure. In general, the computing system 100 can include a host system 112 that uses the memory system 102. For example, the host system 112 can write data to the memory system 102 and read data from the memory system 102.

In the embodiment illustrated in FIG. 1, the memory system 102 includes a controller 104 and one or more memory devices $106_1$-$106_N$, which may correspond to separate memory channels. In this example, the controller 104 is external to the one or more memory devices $106_1$-$106_N$. The memory devices $106_1$-$106_N$ can provide a storage volume for the memory system 102 and/or the computing system 100 (e.g., the memory devices $106_1$-$106_N$ may be formatted with a particular file system for use by the computing system 100). The controller 104 includes control circuitry (e.g., hardware, firmware, and/or software) for controlling/managing the memory devices $106_1$-$106_N$. In one or more embodiments, the controller 104 is an application specific integrated circuit (ASIC) coupled to a printed circuit board, including a physical interface to the memory devices $106_1$-$106_N$. The controller 104 can utilize one or more processors 108 and/or local memory/storage 110 for use in controlling/managing the memory devices $106_1$-$106_N$. The processor 108 can be a central processing unit, microprocessor, integrated circuit, field programmable gate array, or other circuitry to read, write, and may maintain memory content as well as perform the embodiments set forth in this document and described (e.g., with reference to FIGS. 2-7).

The host system 112 can be a computing device such as a desktop computer, laptop computer, network server, mobile device, a memory card reader, or an interface hub, among other host systems, and can include a memory access device (e.g., one processor (processing device) or multiple processors configured in a parallel processing system or as coprocessors). For example, in one embodiment, the computing system 100 is a personal computer and the host system 112 comprises a central processing unit that carries out the instructions of a computer program by performing the basic arithmetic, logical, control and input/output (I/O) operations specified by the instructions. One or more of these instructions may include or require access (e.g., read or write access) to user data stored in the memory devices $106_1$-$106_N$. Accordingly, the host system 112 may request access to the memory devices $106_1$-$106_N$ via commands or instructions passed to the controller 104 via the host interface 114.

The memory system 102 can include volatile memory devices, non-volatile memory devices, or a combination of volatile and non-volatile memory devices. The memory system 102 can be a storage system (e.g., solid-state drive (SSD)) to be used for data storage in the computing system 100. As a storage system, the memory system 102 can include memory devices $106_1$-$106_N$ that are non-volatile memory devices. For example, the memory devices $106_1$-$106_N$ may be a negative- and (NAND) type flash memory. Each of the memory devices $106_1$-$106_N$ can include one or more arrays of memory cells such as single level cells (SLCs), multi-level cells (MLCs), or quad-level cells (QLCs). Each of the memory cells can store bits of data (e.g., data blocks) used by the host system 112. Although non-volatile memory devices, such as NAND type flash memory, are described, the memory devices $106_1$-$106_N$ can be based on any other type of memory. For example, the memory devices $106_1$-$106_N$ can be, but are not limited to, random access memory (RAM), read-only memory (ROM), dynamic random access memory (DRAM), synchronous dynamic random access memory (SDRAM), phase change memory (PCM), magneto random access memory (MRAM), negative- or (NOR) flash memory, and electrically erasable programmable read-only memory (EEPROM).

In one embodiment, memory devices $106_1$-$106_N$ are a cross-point array of non-volatile memory cells. Cross-point non-volatile memory can perform bit storage based on a change of bulk resistance, in conjunction with a stackable cross-gridded data access array. Additionally, cross point non-volatile memory can perform a write in-place operation (in contrast to many types of Flash-based memory), where a non-volatile memory cell may be programmed without the non-volatile memory cell being previously erased.

The host system 112 is coupled to the memory system 102 via a host interface 114. In one or more embodiments, the host interface 114 is a standardized physical interface. For example, when the memory system 102 is used for data storage in the computing system 100, the host interface 114 may be a serial advanced technology attachment (SATA) interface, a peripheral component interconnect express (PCIe) interface, or a universal serial bus (USB) interface, Fibre Channel, Serial Attached Small Computer System Interface (SCSI) (SAS), among other standardized connectors and interfaces. The host system 112 can further utilize an Non-Volatile Memory Express (NVMe) interface to access the memory devices $106_1$-$106_N$ when the memory system 102 is coupled with the host system 112 by the PCIe interface. In some embodiments, the memory system 102 is a hybrid memory/storage system. The host interface 114 can provide an interface for passing control, address, data, and other signals between the memory system 102 and the host system 112. In general, however, the host interface 114 may be comprised of any set of circuitry and protocols that provide an interface for passing control, address, data, and other signals between the memory system 102 and the host system 112.

The controller 104 communicates with the memory devices $106_1$-$106_N$ to read or write user data, among other operations. The controller 104 can have circuitry that includes one or more integrated circuits, discrete components, and/or code/instructions for managing/controlling the memory devices $106_1$-$106_N$. For example, the local memory/storage 110 can include the remediation event detector 116 and the remediator 118. As will be described in greater detail below, the remediation event detector 116 may include or may use a set of data structures and/or logic for determining when the degree of disturbance caused by writes to neighbor memory cells of a memory device $106_1$-$106_N$ requires remediation by the remediator 118 to ensure data stored in the disturbed memory cell is preserved. The controller 104 couples to a connection/interface of each memory device $106_1$-$106_N$ to receive or transmit the appropriate signal at the appropriate time to carry out an operation (e.g., reading or writing user data). In some embodiments, the communication protocol between the host system 112 and the memory system 102 is different than the protocol used by the controller 104 for access of a memory device $106_1$-$106_N$. In these embodiments, the controller 104 may translate the commands/signals received from the host system 112 into the appropriate commands/signals to achieve the desired access to a memory device $106_1$-$106_N$.

Each memory device $106_1$-$106_N$ can include one or more arrays of memory cells (e.g., non-volatile memory cells). The memory cells can be grouped. As used herein, a group includes one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of data per page, 128 pages per block, 2048 blocks per plane, and 16 planes per device. Sets of memory cells in a memory device 106 may be referenced using an assigned address or another identifier. In particular, an address may be assigned to one or more memory cells in a memory device 106 such that the address may be used for accessing the corresponding memory cells (e.g., reading the one or more memory cells or writing to the one or more memory cells).

A group of memory cells in a memory device 106 may be used for storing user data (e.g., codewords). For example, each memory cell in a memory device 106 may be used for storing a single bit of user data. In some embodiments, the user data stored in the memory devices $106_1$-$106_N$ include or are stored along with parity bits that are used to correct for errors introduced while the user data is stored in the memory devices $106_1$-$106_N$ and/or while the user data is being read from the memory devices $106_1$-$106_N$. For example, the errors may be caused by noise experienced by the memory devices $106_1$-$106_N$ (e.g., electromagnetic radiation), which causes bits to be flipped in the memory devices $106_1$-$106_N$ and/or errors caused by writes to neighbor memory cells in a memory device 106 (e.g., heat/thermal energy caused by a write to an aggressor memory cell that dissipates to neighbor/victim memory cells).

The memory devices $106_1$-$106_N$ may be resistance memory devices such that each of the memory cells that make up a memory device 106 is a resistance memory cell. For example, each memory device $106_1$-$106_N$ may represent a die providing two-dimensional or three-dimensional phase change material and switching (PCMS) memory. In such an embodiment, each of the memory cells of the memory devices $106_1$-$106_N$ is a phase change memory cell.

Figure 2:
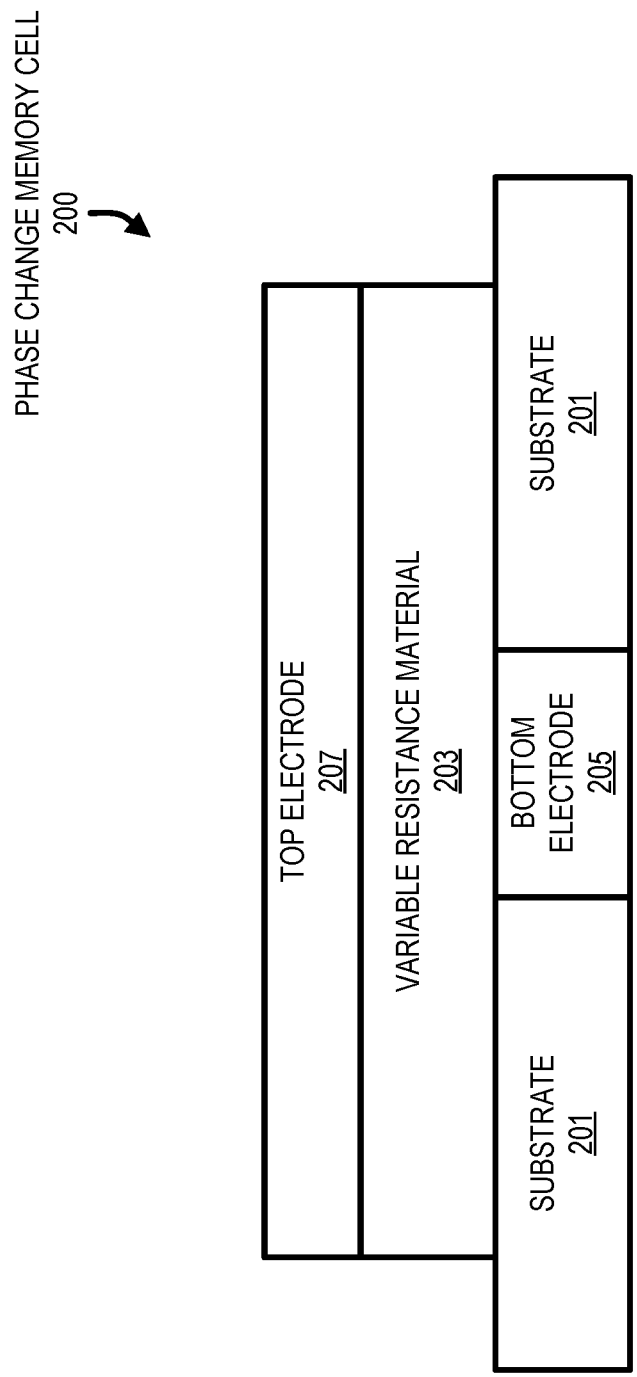
FIG. 2 shows a basic composition of a phase change memory cell constructed over a substrate, having a variable resistance material formed between a bottom electrode and a top electrode, in accordance with one or more embodiments.

FIG. 2 shows a basic composition of a phase change memory cell 200 (e.g., in a memory device $106_1$-$106_N$) constructed over a substrate 201, having a variable resistance material 203 formed between a bottom electrode 205 and a top electrode 207. One type of variable resistance material 203 may be amorphous silicon doped with V, Co, Ni, Pd, Fe and Mn. Another type of variable resistance material 203 may include perovskite materials such as Pr(1-x)CaxMnO3 (PCMO), La(1-xCaxMnO3(LCMO), LaSrMnO3 (LSMO), GdBaCoxOy (GBCO). Still another type of variable resistance material 203 may be a doped chalcogenide glass of the formula AxBy, where B is selected from among S, Se and Te and mixtures thereof, and where A includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At) of the periodic table, and with the dopant being selected from among the noble metals and transition metals, including Ag, Au, Pt, Cu, Cd, Ir, Ru, Co, Cr, Mn or Ni. Yet another type of variable resistance material 203 includes a carbon-polymer film comprising carbon black particulates or graphite, for example, mixed into a plastic polymer. The material used to form the illustrated bottom and top electrodes 205 and 207 may be selected from a variety of conductive materials, such as tungsten, nickel, tantalum, titanium, titanium nitride, aluminum, platinum, or silver, among others.

The variable resistance material 203 may be in an amorphous phase or a crystalline phase. The resistance of the variable resistance material 203 is different when in the amorphous phase in comparison to when in the crystalline phase. In particular, the variable resistance material 203 has a higher resistivity when in the amorphous phase than when in the crystalline phase. As described herein, the phase of the variable resistance material 203 and, by extension, the resistivity of the variable resistance material 203 may be equated, linked, or otherwise associated with a binary value. In one example embodiment, the amorphous phase with a first resistivity (or first resistivity range) corresponds to a binary value of "0" or False (i.e., a reset/unset state) and the crystalline phase with a second resistivity (or second resistivity range) may correspond to a binary value of "1" or True (i.e., a set state). In other embodiments, the association between phases/resistivity of the variable resistance material 203 and binary values may be switched/flipped.

Although the variable resistance material 203 has been described as having only two phases (e.g., an amorphous phase and a crystalline phase), in other embodiments, the variable resistance material 203 may have more than two phases. For example, the variable resistance material 203 may have a single amorphous phase and two crystalline phases (e.g., cubic and hexagonal crystalline phases). For purposes of explanation, the variable resistance material 203 will be described in relation to two phases (e.g., an amorphous phase and a crystalline phase); however, the systems, methods, and devices described herein may operate similarly when the variable resistance material 203 has more than two phases.

The transition from one phase to another phase (e.g., from the amorphous phase to the crystalline phase or from the crystalline phase to the amorphous phase) occurs in response to temperature changes of the variable resistance material 203. The temperature changes (i.e., heating and cooling) may be caused by passing differing strengths of current through the variable resistance material 203. For example, the electrodes 205 and 207 may place the variable resistance material 203 in a crystalline phase by passing a crystallizing current through the variable resistance material 203, thus warming the variable resistance material 203 to a temperature wherein a crystalline structure may grow. The electrodes 205 and 207 may use a stronger melting current to melt the variable resistance material 203 for subsequent cooling to the amorphous phase. When the phase change memory cell 200 uses the crystalline phase to represent a binary value of "1" or True and the amorphous phase to represent a binary value of "0" or False, the crystallizing current may be referred to as a write or set current and the melting current may be referred to as an erase or reset current. However, as described above, the assignment of phases to binary values may be switched.

Figure 3:
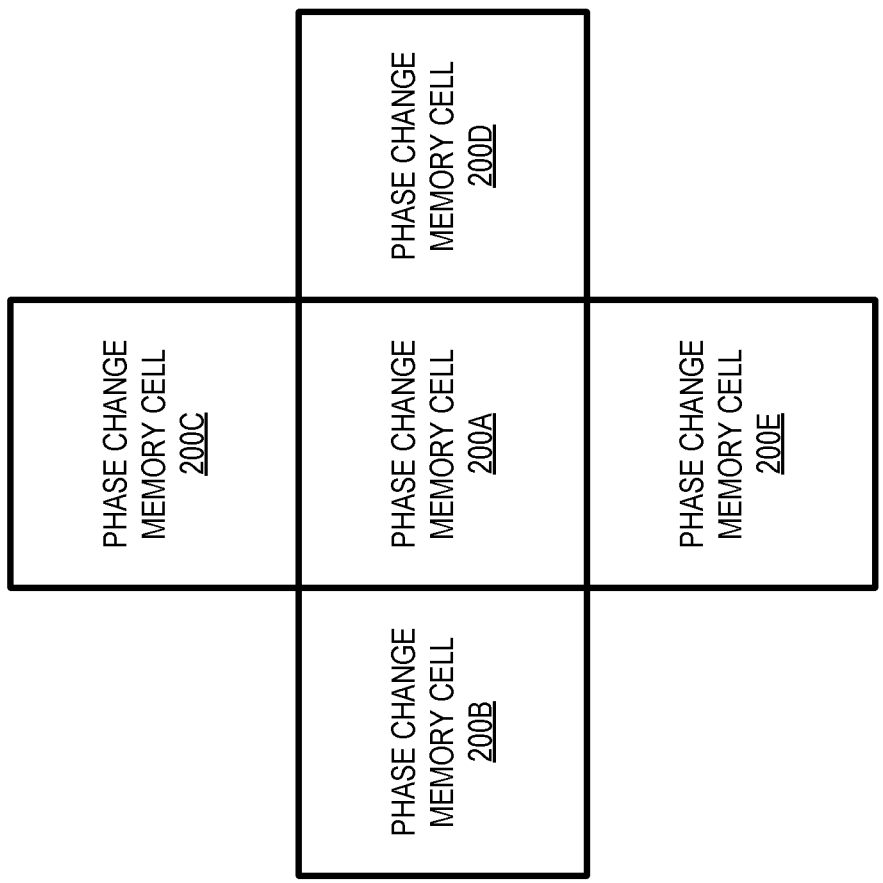
FIG. 3 shows an overhead view of a set of phase change memory cells in a memory device, in accordance with one or more embodiments.

FIG. 3 shows an overhead view of a set of phase change memory cells 200A-200E in a memory device 106$_1$. As used herein, a first phase change memory cell 200 is neighboring a second phase change memory cell 200 when the first and second phase change memory cells 200 are directly adjacent and/or there are no intermediate phase change memory cells 200 between the first and second phase change memory cells 200. For example, as shown in FIG. 3, the phase change memory cells 200B-200E may be considered adjacent or neighbors to phase change memory cell 200A, as there are no other phase change memory cells 200 between each of the phase change memory cells 200B-200E and the phase change memory cell 200A. Although shown in a two-dimensional representation, a neighboring relationship between phase change memory cells 200 may also be present in three-dimensions (i.e., phase change memory cells 200 are stacked along separate planes).

Although the controller 104 may be writing to a particular phase change memory cell 200, effects from a write operation may be felt by neighbor phase change memory cells 200. For example, the controller 104 may apply a crystallizing current through the variable resistance material 203 of the phase change memory cell 200A, thus warming the variable resistance material 203 to a temperature wherein a crystalline structure may grow. Heat/thermal energy from this write operation of the phase change memory cell 200A (the aggressor phase change memory cell 200A) may naturally dissipate or flow to one or more of the neighbor phase change memory cells 200B-200E (victim phase change memory cells 200B-200E). With sufficient accumulation of this heat/thermal energy from repeated writes (particularly over a relatively short period of time (e.g., 0-400 milliseconds)), the state/phase of the neighbor phase change memory cells 200B-200E may be perturbed to the point that the controller 104 may no longer be able to reliably determine the state of the neighbor phase change memory cells 200B-200E (i.e., the controller 104 may no longer be able to determine the binary value represented by one or more of the phase change memory cells 200B-200E even with associated parity bits). To correct for disturbances to neighbor phase change memory cells 200B-200E, a remediation technique may be performed. As will be described in greater detail below, remediation may include selectively rewriting/refreshing the state of neighbor phase change memory cells 200B-200E when the disturbance reaches a disturb threshold.

The remediation event detector 116 may determine when the disturbance to a phase change memory cell 200 has reached the disturb threshold such that the remediator 118 can take action. In one embodiment, the remediation event detector 116 may determine the disturbance level to a phase change memory cell 200 based on a last write timestamp and/or a disturb counter. For example, FIG. 4 shows a set of data structures 400 that may be used by the remediation event detector 116 to determine when effects to phase change memory cell 200A caused by writes to neighbor phase change memory cells 200B-200E have reached a disturb threshold (e.g., heat/thermal energy from writes to phase change memory cells 200B-200E has been absorbed by the phase change memory cell 200A and has altered the phase of the phase change memory cell 200A).

Figure 4:
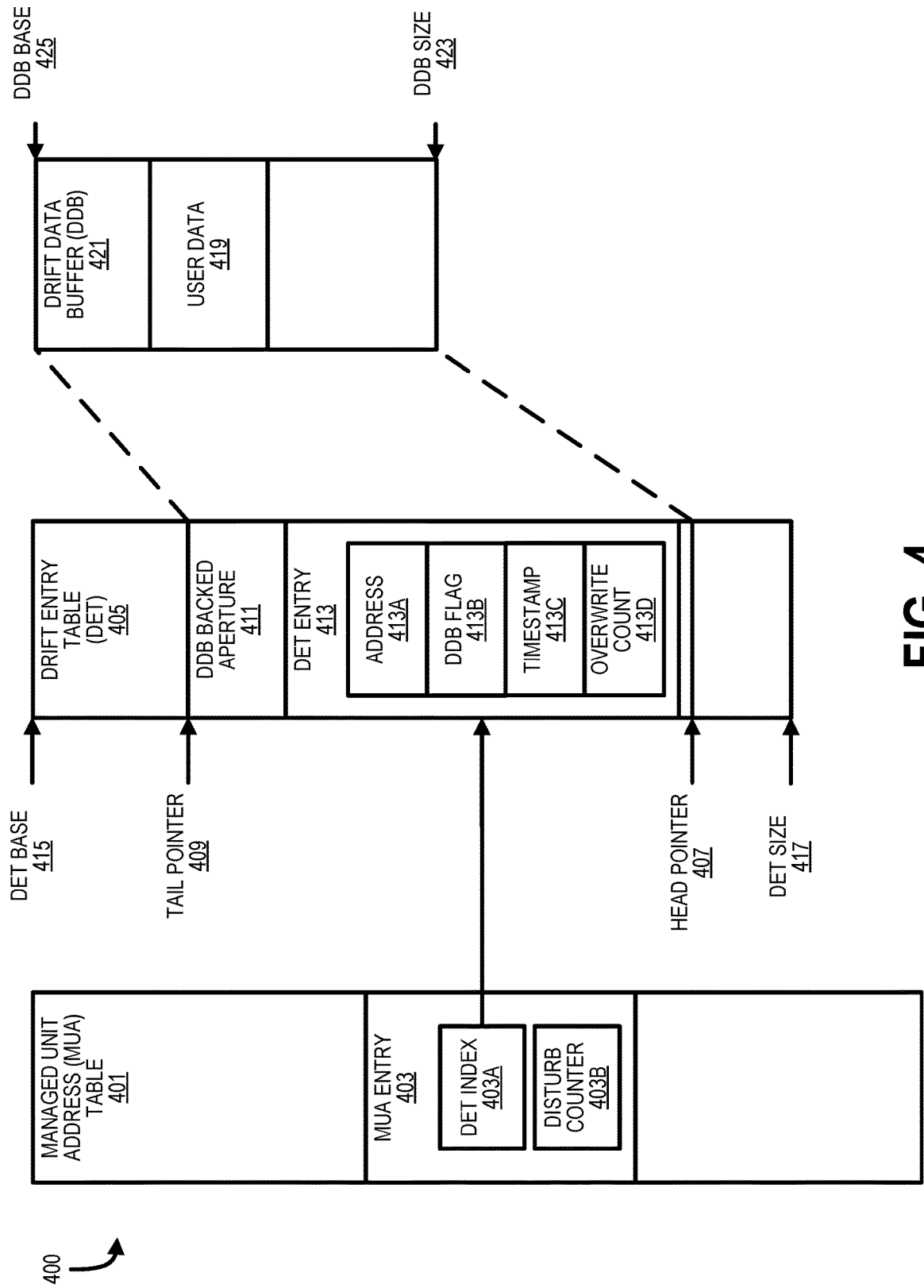
FIG. 4 shows a set of hierarchical data structures, which include a timestamp and/or overwrite count for each phase change memory cell in a set of memory devices, in accordance with one or more embodiments.

As shown in FIG. 4, the set of data structures 400 may include a Managed Unit Address (MUA) table 401. The MUA table 401 may be used for indicating the location of data in a memory hierarchy and/or for determining when effects to phase change memory cells 200 caused by writes to neighbor phase change memory cells 200 have reached a disturb threshold. In one embodiment, the MUA table 401 includes MUA entries 403 corresponding to each of the phase change memory cells 200A-200E. In one embodiment, the controller 104 indexes the MUA entries 403 based on an address or another identifier of the phase change memory cells 200 (e.g., indexed based on MUA addresses for the phase change memory cells 200A-200E). Although described as indexing based on a MUA address, the MUA entries 403 may be indexed using a logical index rather than a physical index. In particular, an access request from a host system 112 may provide a logical address. The controller 104 uses the logical address to index the MUA table 401 (e.g., the memory system 102 may function to provide address translation). For example, the controller 104, via the MUA table 401, may identity map that logical address to a physical address (i.e., a phase change memory cells 200 in the topology) or the controller 104 may redirect that logical address to some non-identity mapped address for a phase change memory cell 200, supporting indirection between logical and physical.

The MUA table 401 references or points to a Drift Entry Table (DET) 405. For example, the MUA table 401 may include data corresponding to a head pointer 407 and a tail pointer 409 of a Drift Data Buffer (DDB) backed aperture 411 in the DET 405 (i.e., the in-use portion of the DET 405). Further, each of the MUA entries 403 may include a DET index 403A and a disturb counter 403B. In one embodiment, the DET index 403A of a MUA entry 403 is an offset (e.g., a pointer) to a DET entry 413 in the DDB backed aperture 411 of the DET 405 and the disturb counter 403B indicates the level/degree of disturbance experienced by an associated phase change memory cell 200. A MUA entry 403 may have a DET index 403A if a phase change memory cell 200 corresponding to the MUA entry 403 was written within a specified time period (e.g., zero seconds to one-milliseconds since the phase change memory cell 200 has been written). Each DET index 403A points to a single DET entry 413 such that the DET indices 403A and the DET entries 413 share a one-to-one relationship.

Each DET entry 413 may include various pieces of data. For example, in some embodiments, each DET entry 413 includes one or more of an address 413A (e.g., an MUA address or another identifier corresponding to the MUA entry 403 and consequently the phase change memory cells 200 associated with the MUA entry 403); a DDB flag 413B indicating whether user data 419 associated with the phase change memory cells 200 have been stored/cached in the hierarchical data structures 400 (e.g., when the DDB flag 413B is set to true, user data 419 for the associated phase change memory cells 200 is stored/cached in the hierarchical data structures 400); a write timestamp 413C indicating when the associated phase change memory cells 200 were last written for use in determining disturbance effects to the phase change memory cells 200 relative to time; and an overwrite count 413D indicating the number of times associated phase change memory cells 200 have been overwritten for use in determining portions of the memory devices 106 that have been heavily overwritten and may develop excessive wear or hotspots.

In one embodiment, the remediation event detector 116 uses the write timestamp 413C and/or the overwrite count 413D to determine an increment/bump value for incrementing/bumping disturb counters 403B for neighbor phase change memory cells 200. For example, after a write to the aggressor phase change memory cell 200A, the remediation event detector 116 increments the overwrite count 413D of a corresponding DET entry 413 and records the current time for updating the timestamp 413C of the DET entry 413. Based on the current time and the time recorded in the timestamp 413C of the DET entry 413, which indicates the last write to the aggressor phase change memory cell 200A, the remediation event detector 116 determines the time difference between the current write and the previous write to the aggressor phase change memory cell 200A. The remediation event detector 116 can locate each neighbor phase change memory cell 200 relative to the aggressor phase change memory cell 200A (i.e., the neighbor phase change memory cells 200B-200E) and determine an increment/bump value for a disturb counter 403B of each neighbor phase change memory cell 200 based on the calculated time difference between writes and, optionally, the overwrite count 413D. In particular, when the time difference between writes is low, the remediation event detector 116 determines that heat/thermal energy dissipated from these rapid writes to the aggressor phase change memory cell 200A is building up on neighbor phase change memory cells 200B-200E and may cause unintended alternations to the states of these neighbor phase change memory cells 200B-200E.

After incrementing disturb counters 403B of neighbor phase change memory cells 200, the remediation event detector 116 determines whether these incremented disturb counters 403B have reached a disturb threshold. Upon determining that a disturb counter 403B of a neighbor phase change memory cell 200 has reached a disturb threshold, the remediation event detector 116 triggers the remediator 118 to perform a remediation operation on this neighbor phase change memory cell 200 whose disturb counters 403B has reached the disturb threshold.

Although the above technique may provide highly accurate determinations as to when disturb effects to phase change memory cells 200 require remediation, the overhead involved in implementing such a technique may be prohibitively high. In particular, the storage space required to store a timestamp 413C for each DET entry 413 may be large and outweigh the fidelity offered by this technique.

Figure 5:
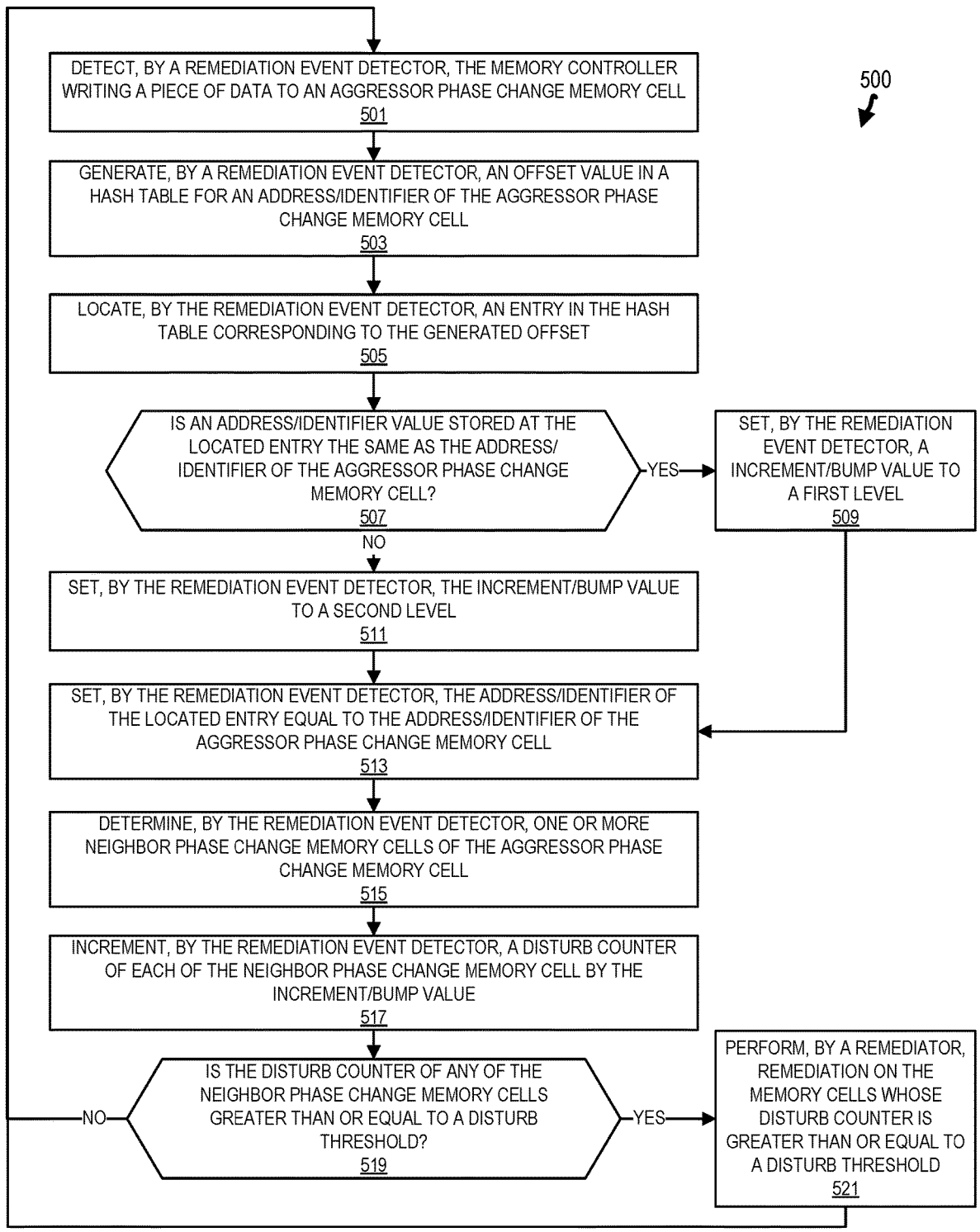
FIG. 5 shows a method for determining when remediation is needed for a phase change memory cell by using a hash table that stores phase change memory cell addresses, in accordance with one or more embodiments.

To alleviate the high storage requirements involved in storing/tracking write timestamps for each phase change memory cell 200, the remediation event detector 116 may use an alternative technique, which does not require storing/tracking write timestamps, for determining when remediation is needed for a phase change memory cell 200. For example, FIG. 5 shows a flow diagram of an example method 500 according to some embodiments for determining when remediation is needed for a phase change memory cell 200 by using a hash table or another data structure that stores phase change memory cell 200 addresses or other identifiers. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Each operation of the method 500 may be performed by one or more components of the computing system 100. For example, in some embodiments, the operations of the method 500 are performed by one or more of the remediation event detector 116, the remediator 118, and the processing device 108 of the controller 104 using a hash table.

The operations in FIG. 5 will be described with reference to the exemplary implementations of the other figures. However, it should be understood that the operations of the diagram can be performed by implementations other than those discussed with reference to the other figures, and the implementations discussed with reference to these other figures can perform operations different than those discussed with reference to the diagram. Although described and shown in FIG. 5 in a particular order, the operations of the method 500 are not restricted to this order. For example, one or more of the operations of the method 500 may be performed in a different order or in partially or fully overlapping time periods. Accordingly, the description and depiction of the method 500 is for illustrative purposes and is not intended to restrict to a particular implementation.

Although the method 500 will be described in relation to a single aggressor phase change memory cell 200 and a single set of neighbor phase change memory cells 200, the operations of the method 500 may be performed simultaneously/concurrently for multiple aggressor phase change memory cells 200 and multiple sets of neighbor phase change memory cells 200.

Further, although described in relation to phase change memory cells 200, in other embodiments, the method 500 may be performed in relation to any type of memory cell in which writes to one memory cell (e.g., an aggressor memory cell) have a potentially negative effect on data or a state of another memory cell (e.g., a neighbor or victim memory cell).

The method 500 commences at operation 501 with the remediation event detector 116 detecting/determining that the controller 104 has written to a phase change memory cell 200 of a memory device 106. For example, in the portion of the memory device $106_1$ shown in FIG. 3, the remediation event detector 116 may detect that the controller 104 has written a binary value to the phase change memory device 200A (i.e., aggressor phase change memory cell 200A) in response to a request from a host system 112. The memory device $106_1$ with the phase change memory cells 200A-200E of FIG. 3 will be used to further describe the method 500, but it is understood that the method 500 may be performed in relation to different memory devices 106 with potentially different configurations of phase change memory cells 200.

Writing a binary value (i.e., 0 or 1) to the phase change memory cell 200A includes passing a crystallizing current through the variable resistance material 203 of the phase change memory cell 200A, thus warming the variable resistance material 203 of the phase change memory cell 200A to a temperature wherein a crystalline structure may grow. Alternatively, writing the binary value (i.e., 0 or 1) to the phase change memory cell 200A includes passing a stronger melting current through the variable resistance material 203 of the phase change memory cell 200A to melt the variable resistance material 203 for subsequent cooling to the amorphous phase. In either case, the heat/thermal energy generated from the write to the aggressor phase change memory cell 200A may dissipate to one or more of the neighbor/victim phase change memory cells 200B-200E. As previously noted, with sufficient accumulation of heat/thermal energy from repeated writes (particularly over a relatively short period of time (e.g., 0-400 milliseconds)), the state of the neighbor phase change memory cells 200B-200E may be perturbed to the point that the controller 104 may no longer be able to reliably determine the state of the neighbor phase change memory cells 200B-200E (i.e., the controller 104 may no longer be able to determine the binary value represented by one or more of the phase change memory cells 200B-200E).

Figure 6:
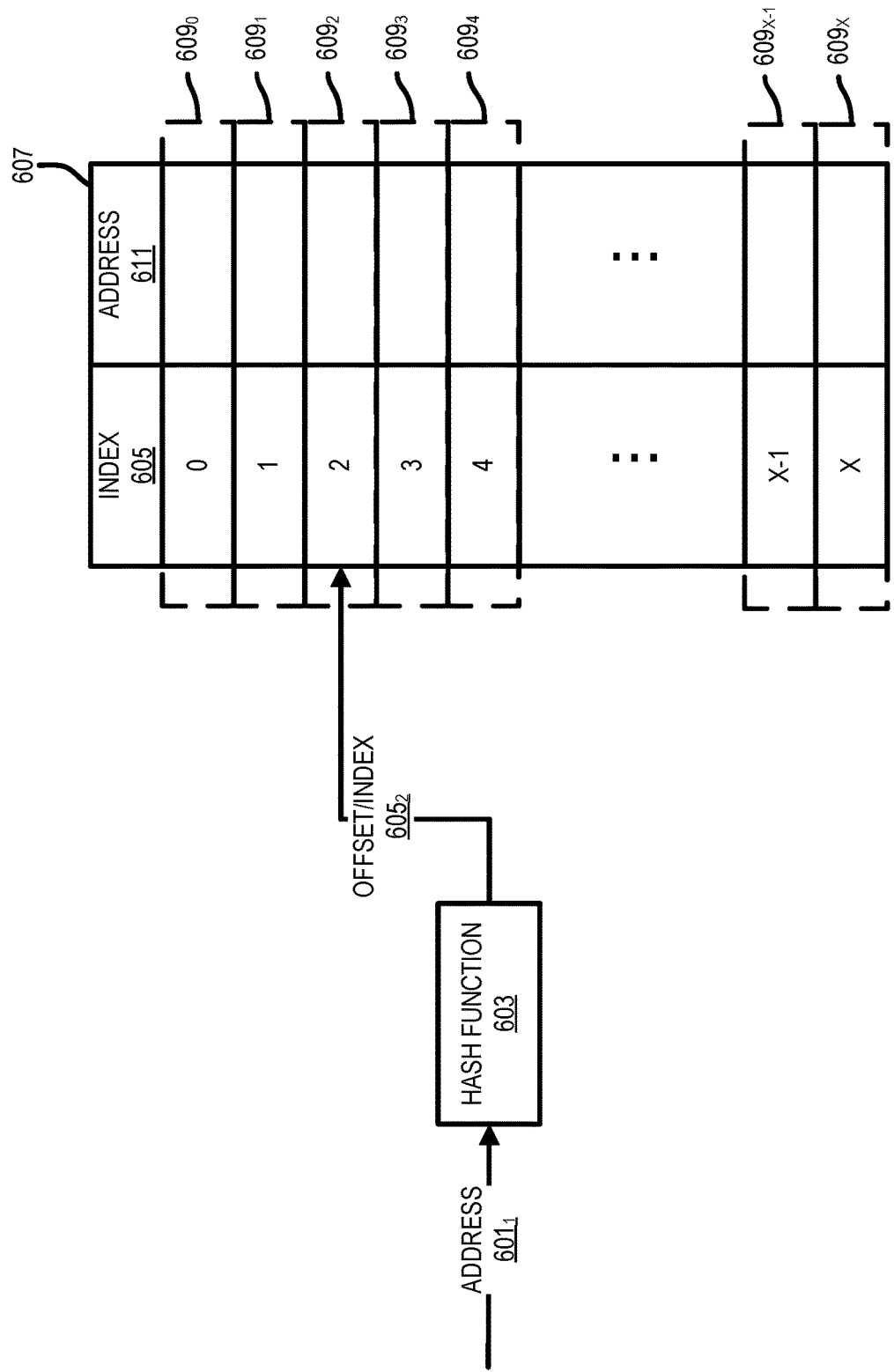
FIG. 6 shows a hash table for detecting temporally proximate writes to phase change memory cells, in accordance with one or more embodiments.

Following detection of the write of the aggressor phase change memory cell 200A, at operation 503, the remediation event detector 116 generates an offset/index value for a hash table or another data structure based on an address or another identifier of the aggressor phase change memory cell 200A. For example, as shown in FIG. 6, an address $601_1$ may be fed to the hash function 603 to produce an offset/index value $605_2$ for the hash table 607. In response to detecting the write of the aggressor phase change memory cell 200A, the remediation event detector 116 writes or maintains the address $601_1$ at entry $609_2$. The address $601_1$ may be a logical or physical address of the aggressor phase change memory cell 200A and the hash function 603 is any function that maps data of an arbitrary size to data of a fixed size. In this case, the hash function 603 maps an arbitrary number of addresses 611, corresponding to phase change memory cells 200, to a fixed number of offsets/index values 605 and associated entries $609_0$-$609_X$ in the hash table 607. Accordingly, multiple addresses 601 of phase change memory cells 200 correspond to a single offset/index 605 and an associated entry $609_0$-$609_X$ in the hash table 607. The phase change memory cell 200 that was most recently written within a given set of memory cells 200 that have addresses 601 that map to the same offset/index 605 is reflected by the address 601 stored at the corresponding entry 609.

At operation 505, the remediation event detector 116 locates an entry 609 in the hash table 607 based on the offset/index value 605 generated for the address $601_1$ of the aggressor phase change memory cell 200A. In particular, using the example above, the remediation event detector 116 may locate at operation 505 an entry 609 with an offset/index value 605 equal to the offset/index value $605_2$ of the aggressor memory cell 200A. As shown in FIG. 6, the offset/index value $605_2$ corresponds to entry $609_2$ (i.e., offset/index value $605_2$ is equal to two).

At operation 507, the remediation event detector 116 determines if the address 611 stored in the located entry $609_2$ is equal/identical or otherwise corresponds to the address $601_1$ of the aggressor phase change memory cell 200A. If the address 611 stored in the located entry $609_2$ is equal to the address $601_1$ of the aggressor memory cell 200A, this strongly indicates that the aggressor phase change memory cell 200A was recently written. Specifically, as noted above, the hash table 607 is constructed such that addresses of multiple phase change memory cells 200 may correspond to the same offset/index value 605. Since the controller 104 is likely to write to memory devices 106 at a high frequency to take advantage of the strong read/write performance of phase change memory devices, detecting an address match at operation 507 indicates a strong probability that the aggressor phase change memory device 200A was recently written. Consequently, neighbor phase change memory cells 200B-200E are recipients of heat/thermal energy from two close/proximate in time writes to the aggressor phase change memory cell 200A.

When the remediation event detector 116 determines at operation 507 that the address 611 stored in the located entry $609_2$ is equal to the address $601_1$ of the aggressor memory cell 200A, the remediation event detector 116 sets an increment/bump level to a first value at operation 509. Conversely, when the remediation event detector 116 determines at operation 507 that the address 611 of the located entry $609_2$ is not equal to the address $601_1$ of the aggressor phase change memory cell 200A, the remediation event detector 116 sets the increment/bump level to a second value at operation 511. In this configuration, the first value is greater than the second value such that the first value indicates that a larger amount of heat/thermal energy may have built-up at one or more of the neighbor phase change memory cells 200B-200E based on the temporal proximity of two writes to the aggressor phase change memory cell 200A. As will be described in greater detail below, the increment/bump level set at operation 509 may be used for adjusting/incrementing disturb counters associated with neighbor phase change memory cells 200 of the aggressor phase change memory cell 200A (e.g., the phase change memory cells 200B-220E).

At operation 513, the remediation event detector 116 sets the address 611 of the located entry $609_2$ equal to the address $601_1$ of the aggressor phase change memory cell 200A. Setting the address 611 of the located entry $609_2$ equal to the address $601_1$ of the aggressor phase change memory cell 200A allows the remediation event detector 116 to later determine whether a subsequent write to the aggressor phase change memory cell 200A is temporally proximate to the write detected at operation 501.

At operation 515, the remediation event detector 116 determines a set of neighbor phase change memory cells 200 relative to the aggressor memory cell 200A (i.e., one or more neighbor phase change memory cells 200). In one embodiment, determining a set of neighbor phase change memory cells 200 relative to an aggressor memory cell 200 may be performed based on an address of the neighbor phase change memory cells 200 and a known configuration of a memory device 106 (i.e., offsets in relation to neighbor phase change memory cells 200). As described above, a phase change memory cell 200 is considered a neighbor to another phase change memory cell 200 when the phase change memory cells 200 are directly adjacent and/or no phase change memory cells 200 separate the two phase change memory cells 200 on a portion of media (e.g., a memory device 106). As described in relation to FIG. 3, the remediation event detector 116 determines at operation 515 that the phase change memory cells 200B-200E to be neighbor phase change memory cells 200 to the aggressor phase change memory cell 200A, as the phase change memory cells 200B-200E are directly adjacent to the phase change memory cell 200A and no phase change memory cells 200 separate each of the phase change memory cells 200B-200E and the aggressor phase change memory cell 200A in the memory device $106_1$.

Figure 7:
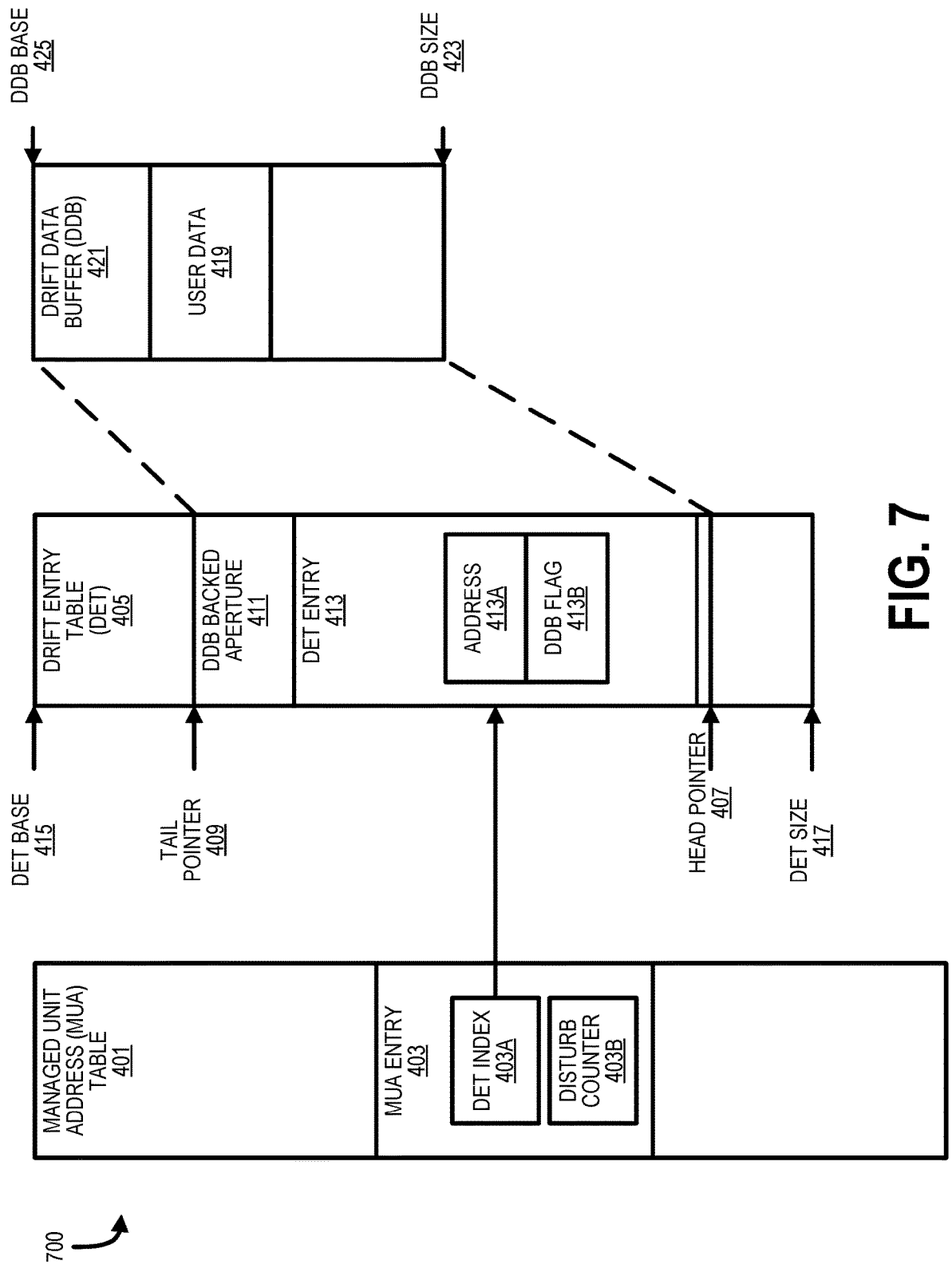
FIG. 7 shows a set of hierarchical data structures without a timestamp and overwrite count, in accordance with one or more embodiments.

At operation 517, the remediation event detector 116 increments a disturb counter for each of the neighbor phase change memory cells 200B-200E by the increment/bump value set at either operation 509 or operation 511 (i.e., the first value or the second value). In one embodiment, the disturb counter for each neighbor phase change memory cell 200B-200E may be located in the MUA table 401. For example, as shown in FIG. 7, a set of data structures 700 may be used for storing various pieces of data in relation to phase change memory cells 200, including disturb counter 403B for each phase change memory cell. As shown in FIG. 7, since the remediation event detector 116 uses the hash table 607 to determine an estimated need for remediation of phase change memory cells 200, timestamps and/or overwrite counters for each phase change memory cell 200 are not needed for determining the estimated remediation need. Although disturb counters 403B are shown in the data structures 700, in alternative embodiments, the disturb counters 403B for each phase change memory cell 200 can be located at any location in the controller 104 or otherwise accessible to the controller 104.

At operation 519, the remediation event detector 116 determines whether the disturb counter 403B for each neighbor phase change memory cell 200B-200E is greater than or equal to a disturb threshold. The disturb threshold indicates a level of disruption that will likely cause the value of a phase change memory cell 200 to be unreadable or the phase of the phase change memory cell 200 to be altered (i.e., change from an amorphous phase to a crystalline phase or from a crystalline phase to an amorphous phase).

Upon determining at operation 519 that a disturb counter 403B of one or more of the neighbor phase change memory cells 200B-200E is greater than or equal to the disturb threshold, the method 500 may move to operation 521. At operation 521, the remediator 118 performs remediation on one or more of the neighbor phase change memory cells 200B-200E whose disturb counter 403B is greater than or equal to the disturb threshold.

In one embodiment, the remediator 118 rewrites the one or more of the neighbor phase change memory cells 200B-200E whose disturb counter 403B is greater than or equal to the disturb threshold. Rewriting nullifies any disturbances encountered by the one or more of the neighbor phase change memory cells 200B-200E as a result of writes from aggressor phase change memory cells 200. Accordingly, in this embodiment, the remediator 118 also resets the disturb counter 403B for the one or more of the neighbor phase change memory cells 200B-200E following the rewrite(s).

In another embodiment, the remediator 118 performs a selective remediation on the one or more of the neighbor phase change memory cells 200B-200E whose disturb counters 403B are greater than or equal to the disturb threshold. In this embodiment, the remediator 118 reads the one or more of the neighbor phase change memory cells 200B-200E and determines the level of disturbance actually encountered by these phase change memory cells 200B-200E (i.e., determines whether values in the neighbor phase change memory cells 200B-200E are readable). In particular, the disturb counter 403B associated with a phase change memory cell 200 is an estimate of the level of disturbance experienced by the phase change memory cell 200 as a result of writes to one or more aggressor phase change memory cells 200. However, this disturbance estimate can be inaccurate to the actual level of disturbance experienced by the phase change memory cell 200. Accordingly, by reading the one or more neighbor phase change memory cells 200B-200E, the remediator 118 can use error detection to determine whether rewriting the one or more neighbor phase change memory cells 200B-200E is necessary. In one embodiment, reading the one or more neighbor phase change memory cells 200B-200E includes reading a codeword of which the one or more neighbor/victim phase change memory cells 200B-200E are a part. In this embodiment, each of the one or more neighbor phase change memory cells 200B-200E are part of separate codewords. Using parity bits associated with the codewords, the remediator 118 determines the level of disturbance experienced by the one or more neighbor phase change memory cells 200B-200E (e.g., the number of bits for which an error was detected). Upon the remediator 118 detecting a high level of disturbance, the remediator 118 rewrites the phase change memory cell 200B-200E and reset the associated disturb counters 403B as described above.

Following operation 519 or operation 521, the method 500 returns to operation 501 for the remediation event detector 116 to detect another write of a phase change memory cell 200 (e.g., a write to one of the phase change memory cells 200A-200E that will act as the aggressor phase change memory cell 200). While illustrated as a loop, in one embodiment, the controller 104 executes multiple instances of method 500 concurrently. As described above, via the method 500, the remediation event detector 116 and the remediator 118 provide remediation services to phase change memory cells 200 with efficient use of resources. In particular, the remediation event detector 116 may utilize a hash table 607 to determine phase change memory cells 200 whose level of disturbance, based on writes from aggressor phase change memory cells 200, requires remediation. While the hash table 607 stores addresses 611 of phase change memory cells 200, the hash table 607 avoids storing addresses 611 of each phase change memory cell 200 by associating multiple phase change memory cells 200 with a single hash table entry 609. Additionally, these embodiments do not need to store write timestamps associated with recently written phase change memory cells 200, which would require a large amount of storage resources. Accordingly, this hash table based approach estimates likely disturbances to phase change memory cells 200 with minimal implementation overhead (e.g., minimal use of storage resources). Further, by taking a selective remediation approach, the method 500 avoids being overly aggressive in remediating phase change memory cells 200.

Although described as the has table 607 only including an index 605 and an address 611, in some embodiments, the hash table 607 may include additional fields. For example, in one embodiment, the hash table 607 includes a write count. The write count indicates the number of phase change memory cell 200 writes the address 611 has remained in a corresponding entry 609 without being replaced with another address 611. For example, the remediation event detector 116 may detect a write to the phase change memory cell 200A. In response, the remediation event detector 116 locates an entry 609 in the hash table 607 based on the address 601 of the phase change memory cell 200A. If the address 611 at the located entry 609 is the same as the address 601 of the phase change memory cell 200A, the remediation event detector 116 increments the write count of the entry 609. Otherwise, the remediation event detector 116 sets the address 611 to the address 601 of the phase change memory cell 200A and sets the write count of the entry to a default value (e.g., zero or one). Accordingly, the write count is incremented each time the phase change memory cell 200A is written without another phase change memory cell 200 associated with the same entry being written to. This write count may be used by the remediation event detector 116 to determine repeated writes to particular portions of a memory device, which would result in a potentially greater disturbance to neighbor phase change memory cells 200 and a consequent larger increment/bump value.

It will be apparent from this description that aspects of the disclosure may be embodied, at least in part, in software or firmware. That is, a computer system or other data processing system (e.g., the remediation event detector 116 and the remediator 118 of the controller 104) may carry out the computer-implemented method 500 in response to its processor or other circuitry executing sequences of instructions contained in local memory/storage 110 or another non-transitory machine-readable storage medium. The software may further be transmitted or received over a network (not shown) via a network interface. In various embodiments, hardwired circuitry may be used in combination with the software instructions to implement the present embodiments. It will also be appreciated that additional components, not shown, may also be part of computing system 100, and, in some embodiments, fewer components than that shown in FIG. 1 may also be used in computing system 100.

An article of manufacture may be used to store program code providing at least some of the functionality of the embodiments described above. Additionally, an article of manufacture may be used to store program code created using at least some of the functionality of the embodiments described above. An article of manufacture that stores program code may be embodied as, but is not limited to, one or more memories (e.g., one or more flash memories, random access memories—static, dynamic, or other), optical disks, CD-ROMs, DVD-ROMs, EPROMs, EEPROMs, magnetic or optical cards or other type of non-transitory machine-readable media suitable for storing electronic instructions. Additionally, embodiments of the invention may be implemented in, but not limited to, hardware or firmware utilizing an FPGA, ASIC, a processor, a computer, or a computer system including a network. Modules and components of hardware or software implementations can be divided or combined without significantly altering embodiments of the invention.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

In the foregoing specification, the invention has been described with reference to specific exemplary embodiments thereof. Various embodiments and aspects of the invention(s) are described with reference to details discussed in this document, and the accompanying drawings illustrate the various embodiments. The description above and drawings are illustrative of the invention and are not to be construed as limiting the invention. References in the specification to "one embodiment," "an embodiment," "an exemplary embodiment," etc., indicate that the embodiment described may include a particular feature, structure, or characteristic, but not every embodiment may necessarily include the particular feature, structure, or characteristic. Moreover, such phrases are not necessarily referring to the same embodiment. Furthermore, when a particular feature, structure, or characteristic is described in connection with an embodiment, such feature, structure, or characteristic may be implemented in connection with other embodiments whether or not explicitly described. Additionally, as used in this document, the term "exemplary" refers to embodiments that serve as simply an example or illustration. The use of exemplary should not be construed as an indication of preferred examples. Blocks with dashed borders (e.g., large dashes, small dashes, dot-dash, dots) are used to illustrate optional operations that add additional features to embodiments of the invention. However, such notation should not be taken to mean that these are the only options or optional operations, and/or that blocks with solid borders are not optional in some embodiments of the invention. Numerous specific details are described to provide a thorough understanding of various embodiments of the present invention. However, in certain instances, well-known or conventional details are not described in order to provide a concise discussion of embodiments of the present inventions.

It will be evident that various modifications may be made thereto without departing from the broader spirit and scope of the invention as set forth in the following claims. For example, the methods described in this document may be performed with fewer or more features/blocks or the features/blocks may be performed in differing orders. Additionally, the method(s) described in this document may be repeated or performed in parallel with one another or in parallel with different instances of the same or similar methods. While examples refer to memory and non-volatile storage media, embodiments may also be implemented with other types of storage media.

What is claimed is:

1. A computer-implemented method for remediating disruptions to memory cells, comprising:
   detecting a write to an aggressor memory cell, wherein the aggressor memory cell has an identifier;
   locating an entry in a data structure based on the identifier of the aggressor memory cell;
   determining, based on the entry in the data structure, an increment value of a disturb counter associated with a neighbor memory cell of the aggressor memory cell;
   incrementing, in response to the write, the disturb counter associated with the neighbor memory cell based on the increment value; and
   performing, in response to the disturb counter being greater than or equal to a disturb threshold, remediation for the neighbor memory cell.

2. The computer-implemented method of claim 1, wherein the aggressor memory cell and the neighbor memory cell are directly adjacent on a portion of a memory device.

3. The computer-implemented method of claim 1, wherein the determining the increment value comprises:
   determining whether an identifier stored in the entry corresponds to the identifier of the aggressor memory cell;
   setting the increment value to a first value when the identifier stored in the entry corresponds to the identifier of the aggressor memory cell; and
   setting the increment value to a second value when the identifier stored in the entry does not correspond to the identifier of the aggressor memory cell.

4. The computer-implemented method of claim 3, wherein the first value is greater than the second value.

5. The computer-implemented method of claim 3, further comprising:
   setting, in response to determining that the identifier stored in the entry is different from the identifier of the aggressor memory cell, the identifier stored in the entry to the identifier of the aggressor memory cell.

6. The computer-implemented method of claim 1, wherein the aggressor memory cell and the neighbor memory cell are phase change memory cells.

7. The computer-implemented method of claim 6, wherein writes to the aggressor memory cell dissipate heat to the neighbor memory cell.

8. The computer-implemented method of claim 1, wherein the performing remediation comprises:
   determining whether errors experienced by the neighbor memory cell are greater than or equal to a threshold value;
   rewriting, in response to determining that the errors experienced by the neighbor memory cell are greater than or equal to the threshold value, data to the neighbor memory cell; and
   resetting, in response to rewriting data to the neighbor memory cell, the disturb counter associated with the neighbor memory cell.

9. A non-transitory machine-readable storage medium, which stores instructions that, when executed by a processor, cause the processor to:
   detect a write to an aggressor memory cell, wherein the aggressor memory cell has an identifier;
   locate an entry in a data structure based on the identifier of the aggressor memory cell;
   determine, based on the entry in the data structure, an increment value for a disturb counter associated with a neighbor memory cell of the aggressor memory cell;
   increment, in response to the write, the disturb counter associated with the neighbor memory cell based on the increment value; and
   perform, in response to the disturb counter being greater than or equal to a disturb threshold, remediation for the neighbor memory cell.

10. The non-transitory machine-readable storage medium of claim 9, wherein the aggressor memory cell and the neighbor memory cell are directly adjacent on a memory device.

11. The non-transitory machine-readable storage medium of claim 9, wherein the determining the increment value comprises:
   determining whether an identifier stored in the entry corresponds to the identifier of the aggressor memory cell;
   setting the increment value to a first value when the identifier stored in the entry corresponds to the identifier of the aggressor memory cell; and
   setting the increment value to a second value when the identifier stored in the entry does not correspond to the identifier of the aggressor memory cell.

12. The non-transitory machine-readable storage medium of claim 11, wherein the first value is greater than the second value.

13. The non-transitory machine-readable storage medium of claim 11, wherein the instructions further cause the processor to:
   set, in response to determining that the identifier stored in the entry is different from the identifier of the aggressor memory cell, the identifier stored in the entry to the identifier of the aggressor memory cell.

14. The non-transitory machine-readable storage medium of claim 9, wherein the aggressor memory cell and the neighbor memory cell are phase change memory cells.

15. The non-transitory machine-readable storage medium of claim 14, wherein writes to the aggressor memory cell dissipate heat to the neighbor memory cell.

16. The non-transitory machine-readable storage medium of claim 9, wherein the performing remediation comprises:
   determining whether errors experienced by the neighbor memory cell are greater than or equal to a threshold value;
   rewriting, in response to determining that the errors experienced by the neighbor memory cell are greater than or equal to the threshold value, data to the neighbor memory cell; and
   resetting, in response to rewriting data to the neighbor memory cell, the disturb counter associated with the neighbor memory cell.

17. A system comprising:
   a memory device comprising a first memory cell and a second memory cell, wherein the second memory cell is a neighbor of the first memory cell in the memory device; and
   a processing device coupled to the memory device, the processing device configured to:
      detect a write to the first memory cell, wherein the first memory cell has an identifier;
      locate an entry in a data structure based on the identifier of the first memory cell,
      determine, based on the entry in the data structure, an increment value for a disturb counter associated with the second memory cell;
      increment, in response to the write, the disturb counter associated with the second memory cell based on the increment value; and
      perform, in response to the disturb counter of the second memory cell being greater than or equal to a disturb threshold, remediation for the second memory cell.

18. The system of claim 17, wherein the processing device is to determine the increment value by:
   determining whether an identifier stored in the entry corresponds to the identifier of the aggressor memory cell;
   setting the increment value to a first value when the identifier stored in the entry corresponds to the identifier of the aggressor memory cell; and
   setting the increment value to a second value when the identifier stored in the entry does not correspond to the identifier of the aggressor memory cell.

19. The system of claim 18, wherein the first value is greater than the second value.

20. The system of claim 18, wherein the processing device is to set, in response to determining that the identifier stored in the entry is different from the identifier of the aggressor memory cell, the identifier stored in the entry to the identifier of the aggressor memory cell.

* * * * *